United States Patent
Wang et al.

(10) Patent No.: US 7,646,526 B1
(45) Date of Patent: Jan. 12, 2010

(54) DURABLE REFLECTION-CONTROLLABLE ELECTROCHROMIC THIN FILM MATERIAL

(75) Inventors: Zhongchun Wang, Santa Rosa, CA (US); Paul P. Nguyen, San Jose, CA (US)

(73) Assignee: Soladigm, Inc., Milpitas, CA (US)

( * ) Notice: Subject to any disclaimer, the term of this patent is extended or adjusted under 35 U.S.C. 154(b) by 7 days.

(21) Appl. No.: 12/242,897

(22) Filed: Sep. 30, 2008

(51) Int. Cl.
G02F 1/153 (2006.01)
G02F 1/03 (2006.01)
G09G 3/34 (2006.01)

(52) U.S. Cl. .................. 359/275; 359/254; 345/105

(58) Field of Classification Search ......... 359/265–270, 359/272–275, 245–247, 254; 345/49, 105; 349/182–186; 348/814; 250/70; 438/929
See application file for complete search history.

(56) References Cited

U.S. PATENT DOCUMENTS

| 6,647,166 | B2 | 11/2003 | Richardson |
| 7,042,615 | B2 | 5/2006 | Richardson |
| 2002/0018938 | A1* | 2/2002 | Takeuchi et al. ............ 429/317 |
| 2004/0263660 | A1* | 12/2004 | Wang et al. ............ 348/333.01 |

OTHER PUBLICATIONS

M. Hashimoto et al., "Effect of the Predeposition of Gold, Silver, Tin or Lead on the Growth And Crystallization Processes of Amorphous Antimony Layers," Thin Solid Films, 197 (1991).

M. Hashimoto et al., "Nucleation and Growth of Crystallites in Amorphous Antimony Layers on As-Deposited Ultrathin Sublayers of Metal: Copper, Silver, Gold, Tin and Lead," Thin Solid Films, 188 (1990), 95-108.

J.N. Huiberts et al., "Yttrium and lanthanum hydride film with switchable optical properties," Nature, 380, 1996, pp. 231-234.

K.S. Novoselov et al., "Electric Field Effect in Atomically Thin Carbon Films," Science 306, (2004), pp. 666-669.

Z. Wu et al., "Transparent, Conductive Carbon Nanotube Films," Science, vol. 305, Aug. 27, 2004, pp. 1274-1276.

* cited by examiner

*Primary Examiner*—Scott J Sugarman
*Assistant Examiner*—Dawayne A Pinkney
(74) *Attorney, Agent, or Firm*—Joseph P. Curtin, L.L.C.

(57) ABSTRACT

One exemplary embodiment of an electrochromic thin-film material comprises an alloy of antimony and one or more base metals; and/or an alloy of antimony, one or more base metals, and lithium; and/or an alloy of antimony, one or more base metals, lithium, and one or more noble metals. Another exemplary embodiment of an electrochromic thin-film material comprises a multilayer stack, the multilayer stack comprising at least one layer comprising one of antimony, antimony-lithium alloy, antimony-one or more base metals alloy, antimony-one or more base metals-lithium alloy, antimony-one or more base metals-one or more noble metals alloy, and antimony-one or more base metals-one or more noble metals-lithium alloy; and at least one alternating layer comprising one of a base metal and a base-metal alloy. One or more of the base metals comprise Co, Mn, Ni, Fe, Zn, Ti, V, Cr, Zr, Nb, Mo, Hf, Ta, W, Cd, Mg, Al, Ga, In, Sn, Pb, and Bi, and alloys thereof.

27 Claims, 15 Drawing Sheets

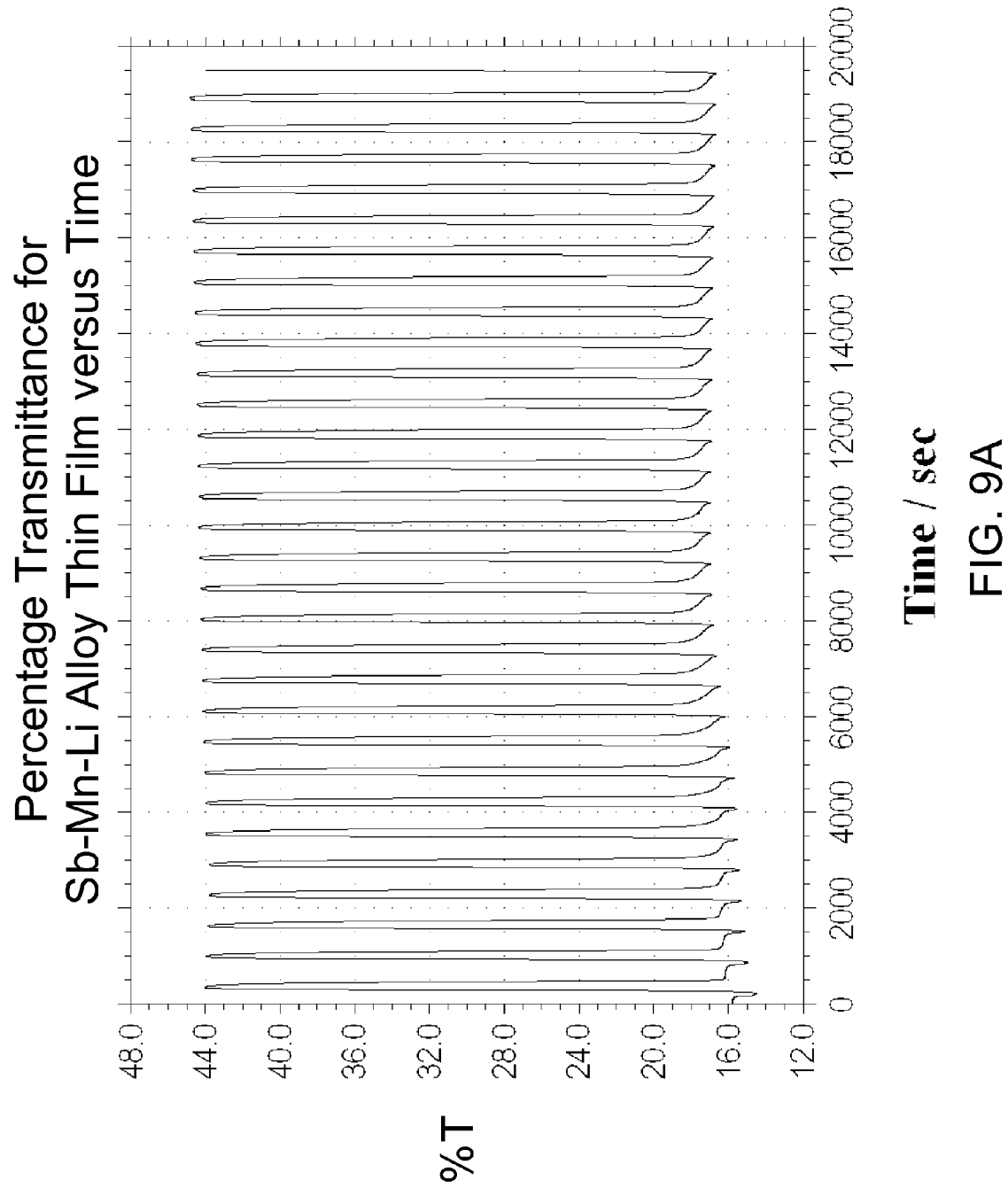

DURABLE REFLECTION-CONTROLLABLE ELECTROCHROMIC THIN FILM MATERIAL

CROSS-REFERENCE TO RELATED APPLICATION

The present patent application is related to U.S. patent application Ser. No. 12/242,917, entitled "Reflection-Controllable Electrochromic Device Using A Base Metal As A Transparent Conductors," filed Oct. 1, 2008 and invented by Zhongchun Wang et al.

BACKGROUND

The subject matter disclosed herein relates to thin-film materials that can be utilized in reflection-controllable electrochromic windows (i.e., light-control glass) for buildings, vehicles, aircraft and watercraft. More particularly, the subject matter disclosed herein relates to highly durable reflection-controllable electrochromic thin-film materials comprising an alloy of antimony, lithium and one or more base metals, and to a multilayer stack comprising antimony or an antimony-lithium alloy and a base metal or a base-metal alloy.

Windows and other openings are generally the place where the most heat enters and escapes buildings. For example, during the winter about 48% of the heat produced by a heating system of a building escapes through windows of the building. During the summer, the proportion of heat that enters an air-conditioned room through the windows can reach about 71%. A tremendous energy savings can, therefore, be realized by effectively controlling light and heat entering and escaping through windows. Light-control glass has been developed to control the bi-directional flow of light and heat through a window.

There are several ways that light is controlled by light-control glass. One way is to form an electrochromic material on the glass in which the transmissivity of the electrochromic material reversibly changes under application of a current or a voltage. Another way is to form a thermochromic material on the glass in which the transmissivity of the thermochromic material changes with temperature. Yet another way is to use a gastrochromic material that changes its transmissivity by controlling the atmosphere gas. Of these, electrochromic-based light-control glass has been researched in which a tungsten-oxide thin film is used for the light-control layer. Some commercial products based on this type of electrochromic light-control glass have already appeared.

Conventional electrochromic-based light-control glass, including tungsten-oxide-based versions, all control light by absorbing the light using a light-control layer. A significant drawback with absorbing the light is that heat is produced and radiated into a room when the light-control layer absorbs light, thereby diminishing the energy-saving effect of the conventional electrochromic light-control glass. To eliminate this drawback, another approach of reflecting light rather than absorbing light has been considered. Accordingly, a material capable of reversibly switching between a mirror state and a transparent state would be useful.

For a long time, such a material capable of switching between a mirror state and a transparent state was not found, but in 1996 a group in the Netherlands discovered a hydride of a rare earth, such as yttrium or lanthanum, switches between a mirror state and a transparent state under the influence of hydrogen. Such a material is conventionally referred to as a "switchable mirror". See, for example, J. N. Huiberts et al., Nature, 380, 1996, 231. The rare-earth hydrides undergo a large change in transmissivity, and have excellent light-control mirror characteristics. Nevertheless, because a rare-earth element is used in the material, there are problems in terms of resources and cost when rare-earth-hydride-based switchable mirrors are used for window coatings and other applications.

Additionally, conventional metal-hydride-based mirrors suffer from poor cycle life due to the reactive nature of the metal film, which is readily attacked by air or water. Notably, water is one component of the electrolyte in electrochromic hydride mirrors, and may be produced during removal of hydrogen from the mirror film in both electrochromic and gasochromic devices. The life-cycle degradation is conventionally inhibited by using additional barrier layers for protecting the active materials and by sealing devices for preventing access of environmental air and water. The former approach of adding barrier layers is difficult to achieve and may not be effective after long periods of use. The latter approach of sealing does not address the problem of internal sources of water or oxygen.

More recently, U.S. Pat. No. 6,647,166 B2 to T. J. Richardson discloses alloys of magnesium and transitional-metals that can be used as switchable-mirror materials, thereby significantly reducing the cost of materials for electrochromic-based light-control glass.

U.S. Pat. No. 7,042,615 B2 to T. J. Richardson discloses use of a semi-metal, antimony, as a switchable-mirror thin-film material that is based on lithium insertion and extraction. Addition of low-resistivity metals, such as Ag and Cu, to the thin-film material is also disclosed for improving the cycling stability of the mirrors. The added low-resistivity metals reduce the volume change and increase the conductivity of the switchable-mirror thin-film materials in all states of charge, thereby improving the uniformity of the current density across the thin film and reducing the stress between regions of different composition. For an antimony film containing 33% copper, the volume change on full lithiation is about 70% as opposed to 136% for pure Sb. The resulting semiconducting phase is diluted by copper and, therefore, less prone to coarsening on delithiation. Nevertheless there exists a serious problem with noble metals, such as Ag and Cu, if used as an additive. For example, when noble metals are added in the active layer of an all-solid-state electrochromic device, the noble metals can easily migrate (referred to herein as "electromigration") into the solid electrolyte layer and create shorts for the device (and, thus, a failed device), particularly when an electric field is applied to the device to switch the state of the device, and the solid electrolyte layer of the device is relatively thin (for example, less than about 100 nm in thickness).

BRIEF DESCRIPTION OF THE DRAWINGS

The subject matter disclosed herein is illustrated by way of example and not by limitation in the accompanying figures in which like reference numerals indicate similar elements and in which:

FIGS. 9A and 9B respectively show the percentage transmittance and reflectance characteristics for the $Sb_3MnLi_{0.6}$ alloy thin film in a wet cycling cell.

DETAILED DESCRIPTION

Figure 1:
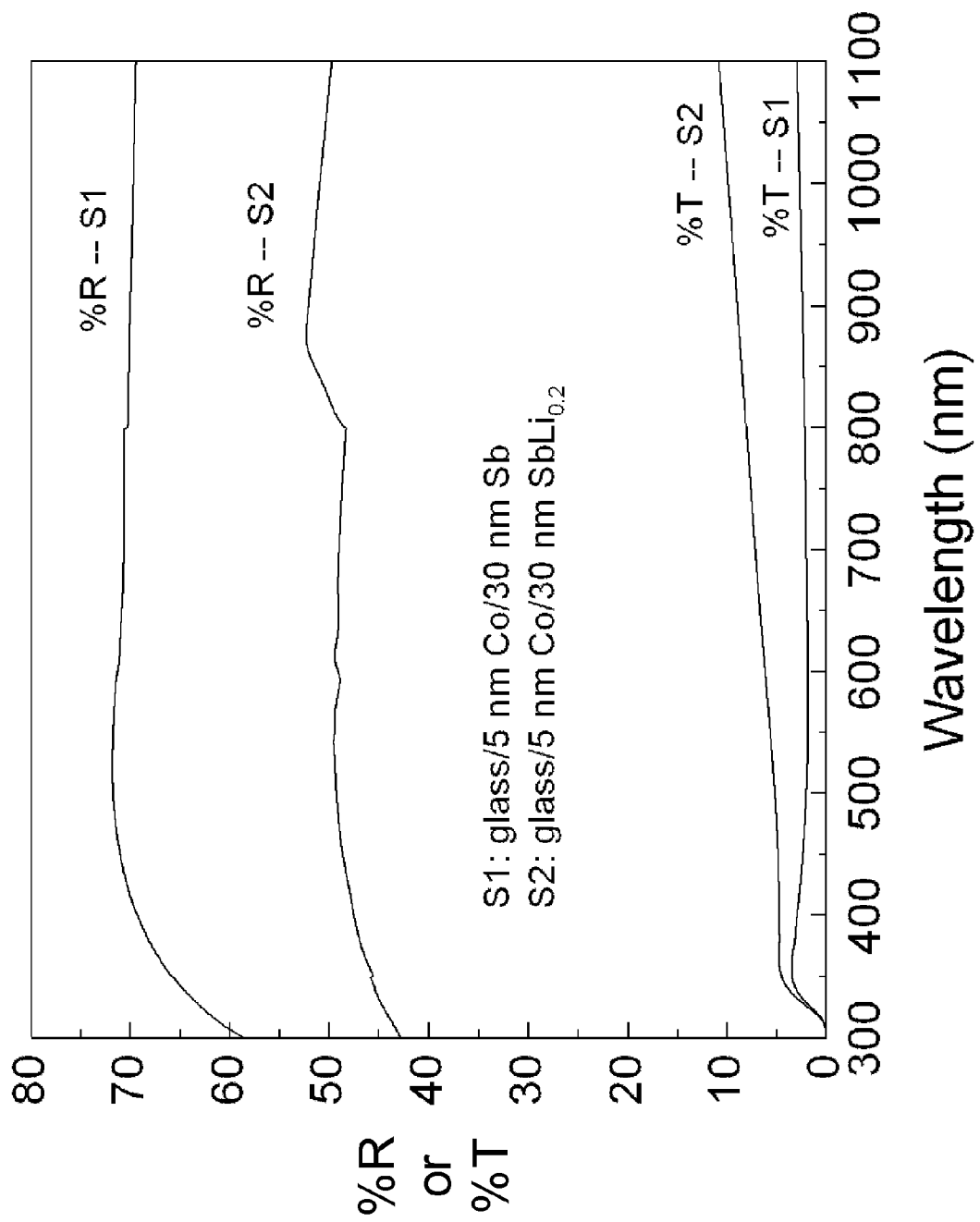
FIG. 1 graphically shows UV-Vis-NIR transmittance and reflectance spectra for baseline thin films of 30 nm Sb and 30 nm $SbLi_{0.2}$ deposited on 5-nm cobalt-coated glass substrates.

As used herein, the word "exemplary" means "serving as an example, instance, or illustration." Any embodiment described herein as "exemplary" is not to be construed as necessarily preferred or advantageous over other embodiments. Additionally, the term "electromigration", as used herein, refers to the phenomenon of migration of a noble metal into a solid electrolyte layer under an applied electric field.

The subject matter disclosed herein relates to thin-film materials that can be utilized in a reflection-controllable electrochromic window (i.e., a light-control window) for controlling the spectral transmissivity of the window of, for example, a building, a vehicle, an aircraft and a watercraft, without using blinds or curtains. More particularly, the subject matter disclosed herein relates to highly durable reflection-controllable electrochromic thin-film materials that can be used as an electrochromic active layer. One exemplary embodiment of a highly durable reflection-controllable electrochromic thin-film material comprises alloys of antimony and lithium. Another exemplary embodiment of a highly durable reflection-controllable electrochromic thin-film material comprises a multilayer thin-film stack formed from antimony or antimony-lithium alloy and a base metal or a base-metal alloy. Suitable base metals comprise Co, Mn, Ni, Fe, Zn, Ti, V, Cr, Zr, Nb, Mo, Hf. Ta, W, Cd, Mg, Al, Ga, In, Sn, Pb, Bi, and alloys thereof. One exemplary embodiment of a thin-film material comprising antimony, a base metal, and lithium, has survived cycling tests in an all-solid-state reflective device for over one hundred cycles with less than 10% of degradation in the switching ranges of both transmission and reflection.

Moreover, when base metals, which are typically much less diffusive than noble metals, are added into the electrochromically active layer of a solid-state electrochromic device, the problems associated with electromigration in the solid-state electrochromic device are eliminated. That is, a thin-film material according to the subject matter disclosed herein does not exhibit electromigration when used in a solid-state electrochromic device. The thin-film material becomes transparent upon lithiation and reflective upon delithiation. Additionally, a protective layer that is formed in a well-known manner from a material that is non-permeable to lithium, oxygen, and water can be optionally formed over the highly durable reflection-controllable electrochromic thin-film material disclosed herein. Examples of suitable materials for the protective layer include silicon oxide, aluminum oxide, silicon aluminum oxide, zirconium oxide, silicon carbide, and silicon oxycarbide.

The subject matter disclosed herein is described in specific terms by several working examples. It should be understood that the subject matter disclosed herein is not limited by the following several working examples.

A thin film formed from antimony, a base metal, and lithium was produced in a well-known manner using a multi-source magnetron sputtering apparatus. The thin film was formed on a glass sheet substrate having a thickness of 3 mm. The glass sheet substrate was washed, placed in a vacuum apparatus, and then subjected to vacuum evacuation. The thin film that was deposited had a typical metallic gloss and was in a mirror state.

FIG. 1 graphically shows UV-Vis-NIR transmittance and reflectance spectra for baseline thin films of 30 nm Sb and 30 nm $SbLi_{0.2}$ deposited on 5-nm cobalt-coated glass substrates. In FIG. 1, the transmittance and reflective spectra for the 30 nm Sb thin film are labeled "S1," and the transmittance and reflective spectra for the 30 nm $SbLi_{0.2}$ thin film are labeled "S2." Prior to the deposition of each thin film, a 5-nm cobalt thin film was sputtered onto a glass substrate to serve as a current-collector layer.

Figure 2A:
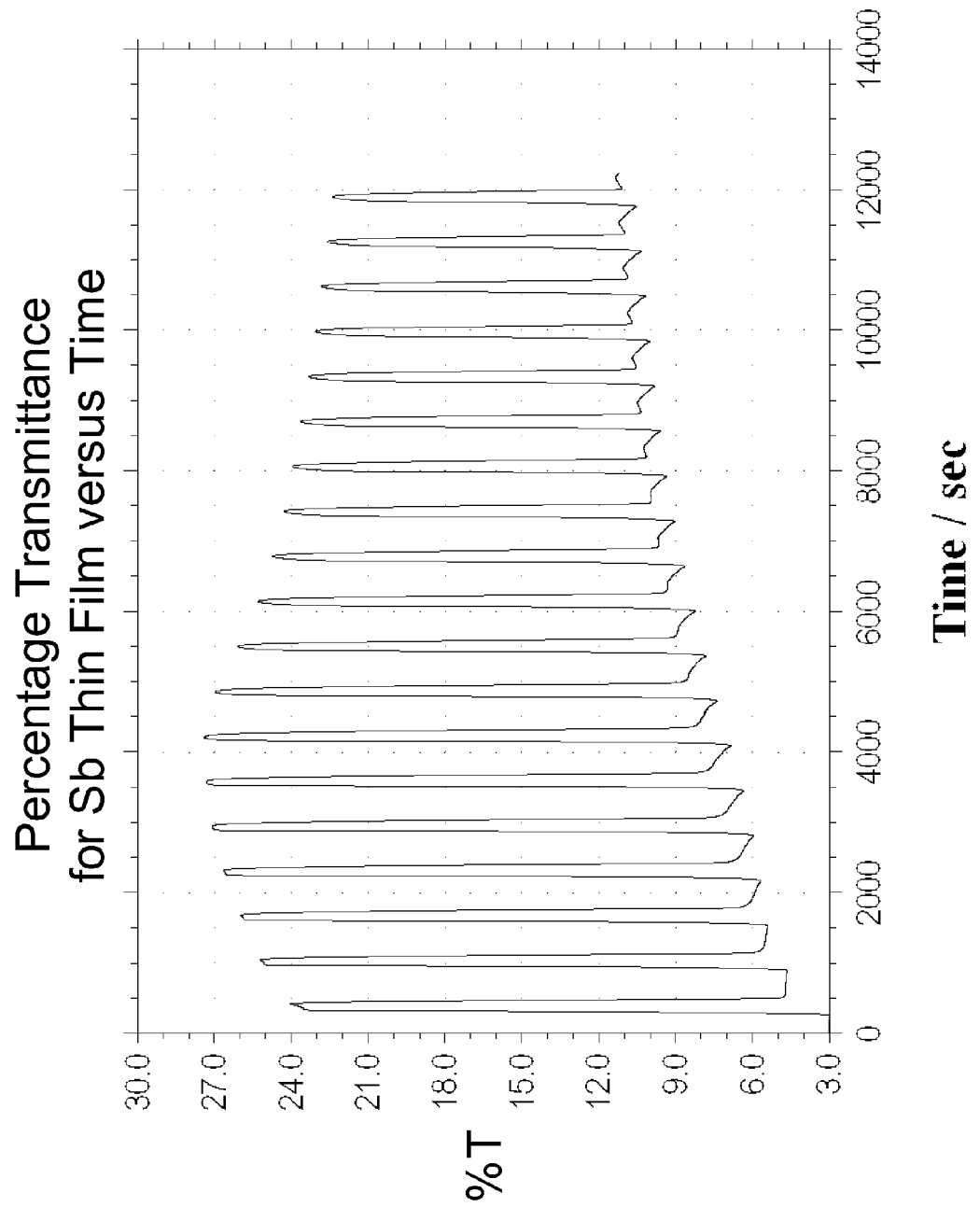
FIGS. 2A and 2B respectively show the percentage transmittance and reflectance for the baseline Sb thin film versus time.
Figure 2B:
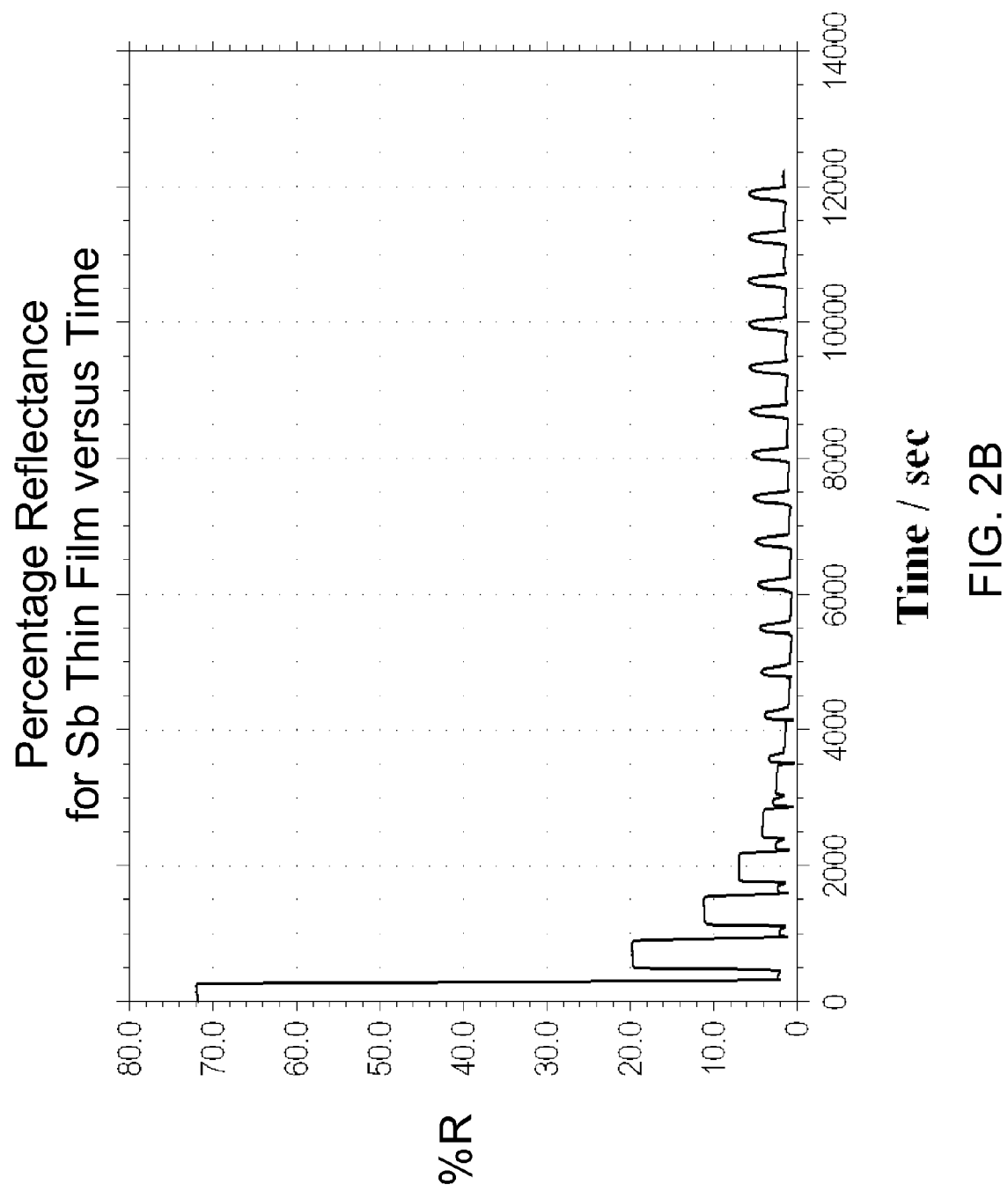
Figure 3A:
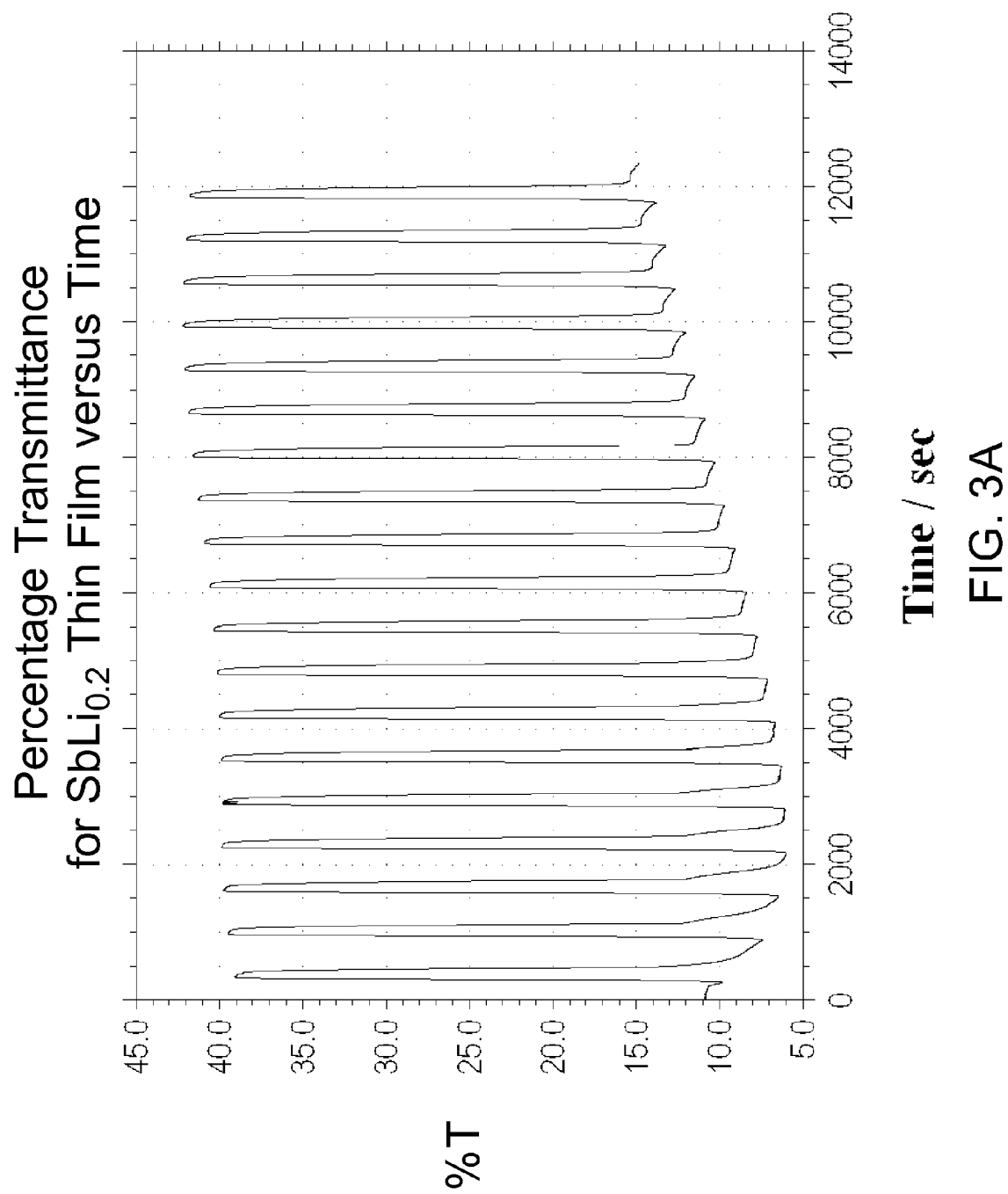
FIGS. 3A and 3B respectively show the percentage transmittance and reflectance for the baseline $SbLi_{0.2}$ thin film versus time.
Figure 3B:
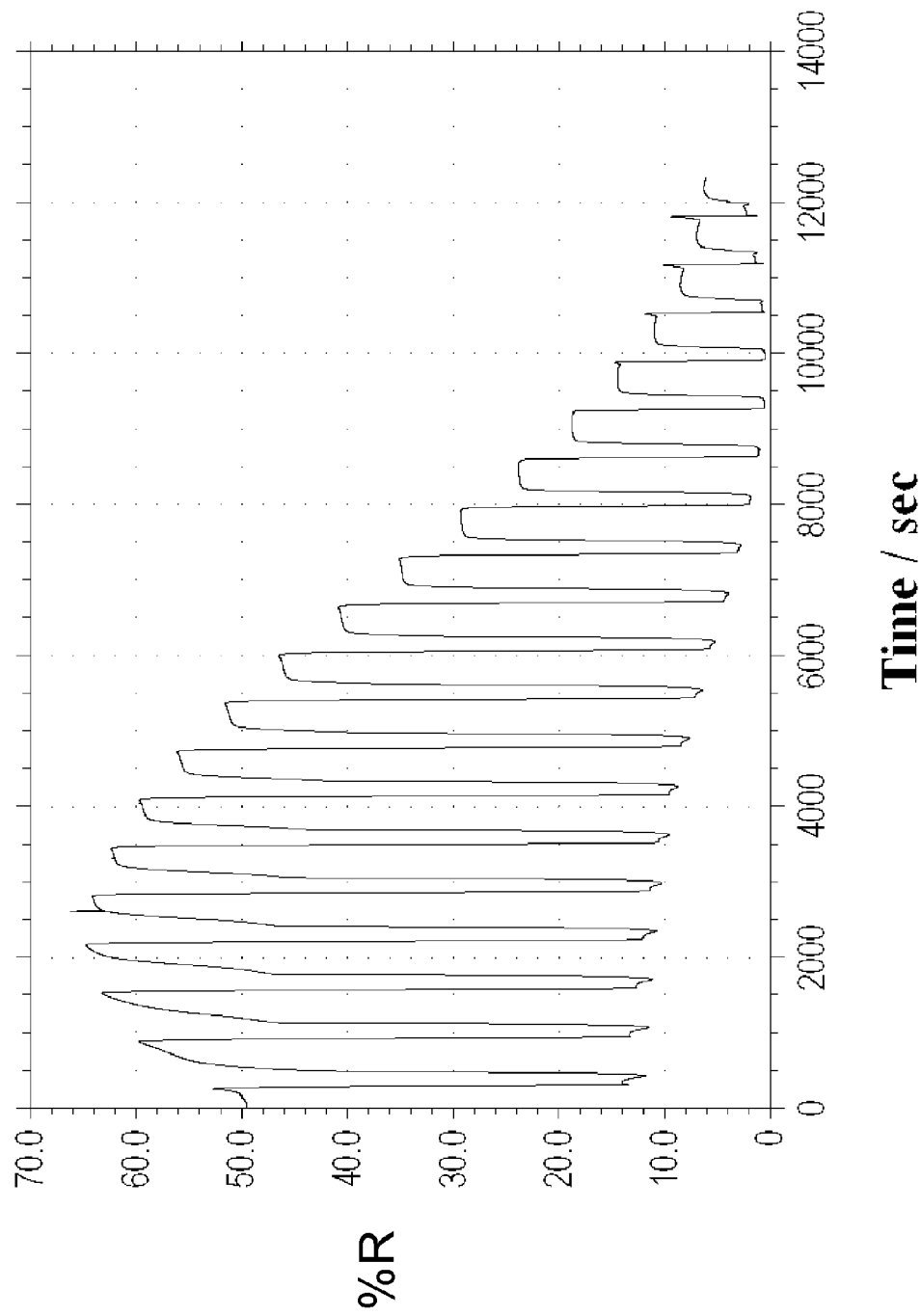

The optical switching characteristics of the two baseline Sb thin films were evaluated by cycling each baseline thin film on a potentiostat in a conventional three-electrode electrochemical cell at 5 mV/s between 0.5 V and 2.1 V vs. Li foil (Electrolyte: 1 M $LiClO_4$ in propylene carbonate). The transmittance and reflectance of the thin-film samples were simultaneously measured versus time during cycling using a Si photo-detector, which is sensitive to photons in the wavelength range of from about 400 nm to about 1100 nm. FIG. 2A graphically shows the plot of percentage transmittance versus time for the baseline Sb thin film. FIG. 2B graphically shows the plot of percentage reflectance versus time for the baseline Sb thin film. As shown in FIGS. 2A and 2B, the pure Sb thin film shows particularly poor cyclibility. FIG. 3A graphically shows the plot of percentage transmittance versus time for the baseline $SbLi_{0.2}$ thin film. FIG. 3B graphically shows the plot of percentage reflectance versus time for the baseline $SbLi_{0.2}$ thin film. FIGS. 3A and 3B show that the $SbLi_{0.2}$ thin film formed by co-sputtering Sb with lithium shows improved durability in comparison to the pure Sb thin film, but quickly degrades after about ten cycles. The degradation is probably due to the low electrical conductivity of lithium antimonide formed upon lithium insertion, which makes it difficult for the lithium to be extracted. Poor electrical conduction could also result from pulverization of the Sb film upon lithium extraction.

Figure 4:
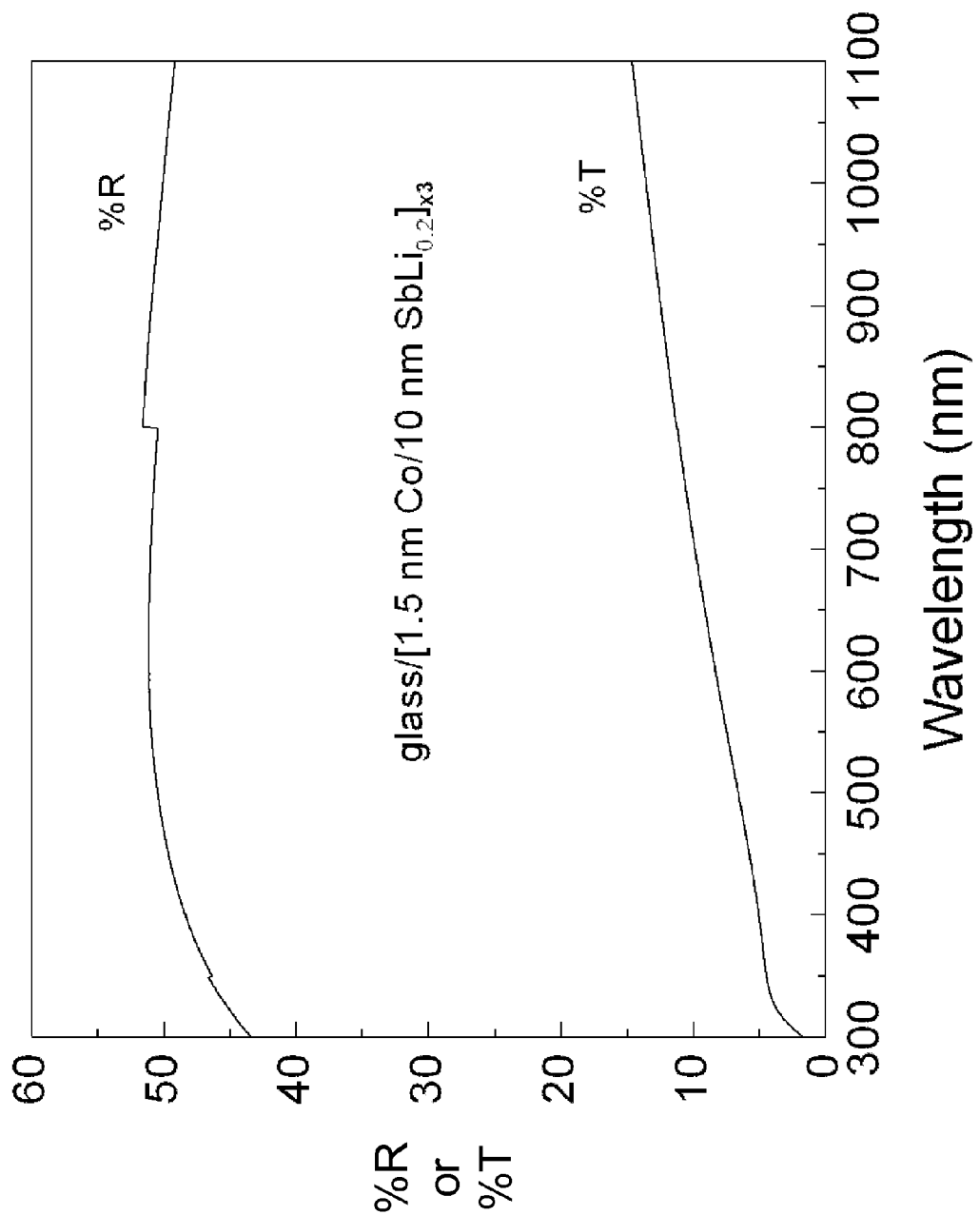
FIG. 4 graphically shows UV-Vis-NIR transmittance and reflectance spectra for a 30-nm multilayer thin-film stack of [1.5 nm Co/10 nm $SbLi_{0.2}]\times_3$ deposited on a glass substrate.
Figure 5A:
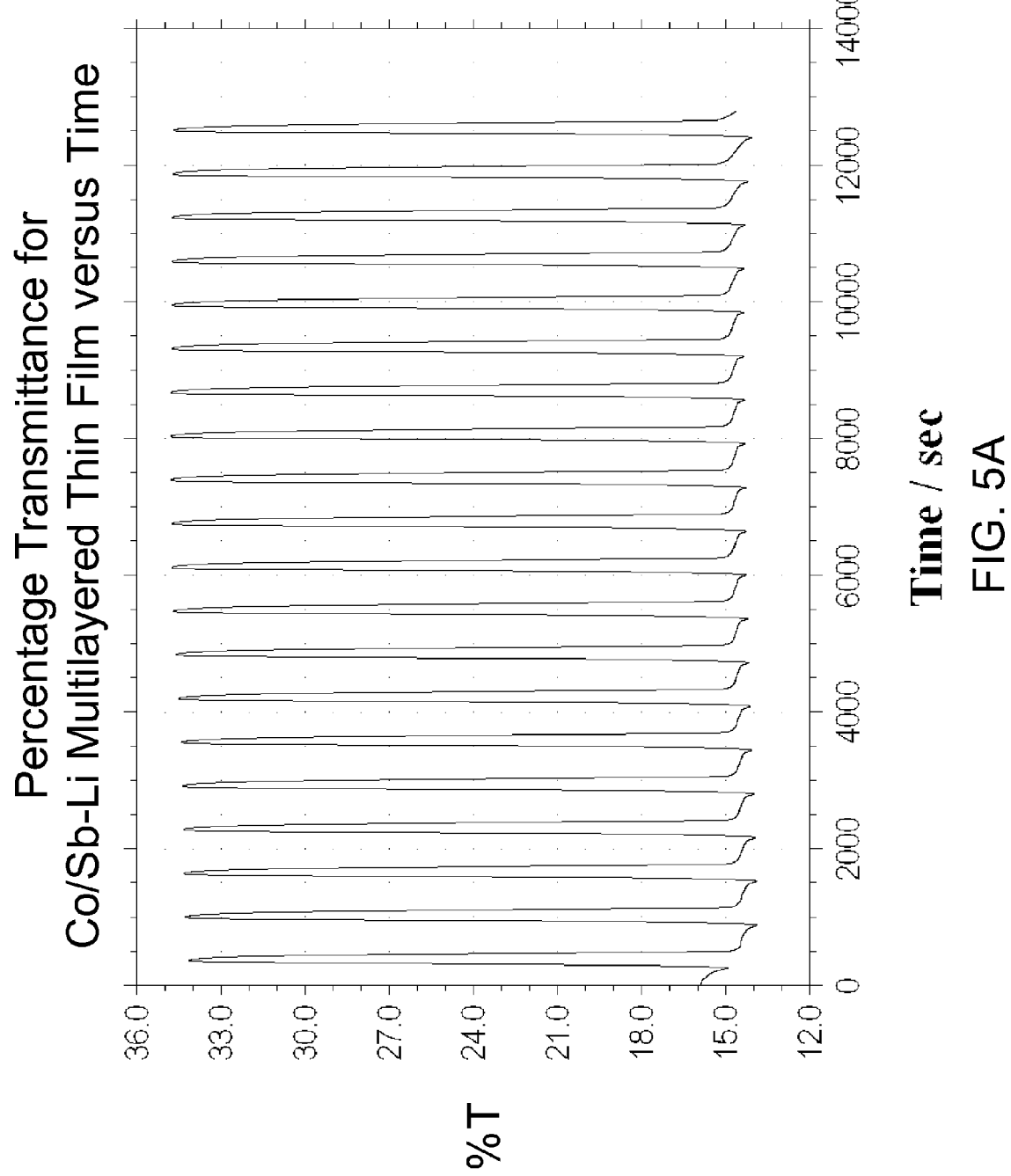
FIGS. 5A and 5B respectively show the percentage transmittance and reflectance characteristics for the 30-nm multilayer thin-film stack of [1.5 nm Co/10 nm $SbLi_{0.2}$]$\times_3$ in a wet cycling cell.
Figure 5B:
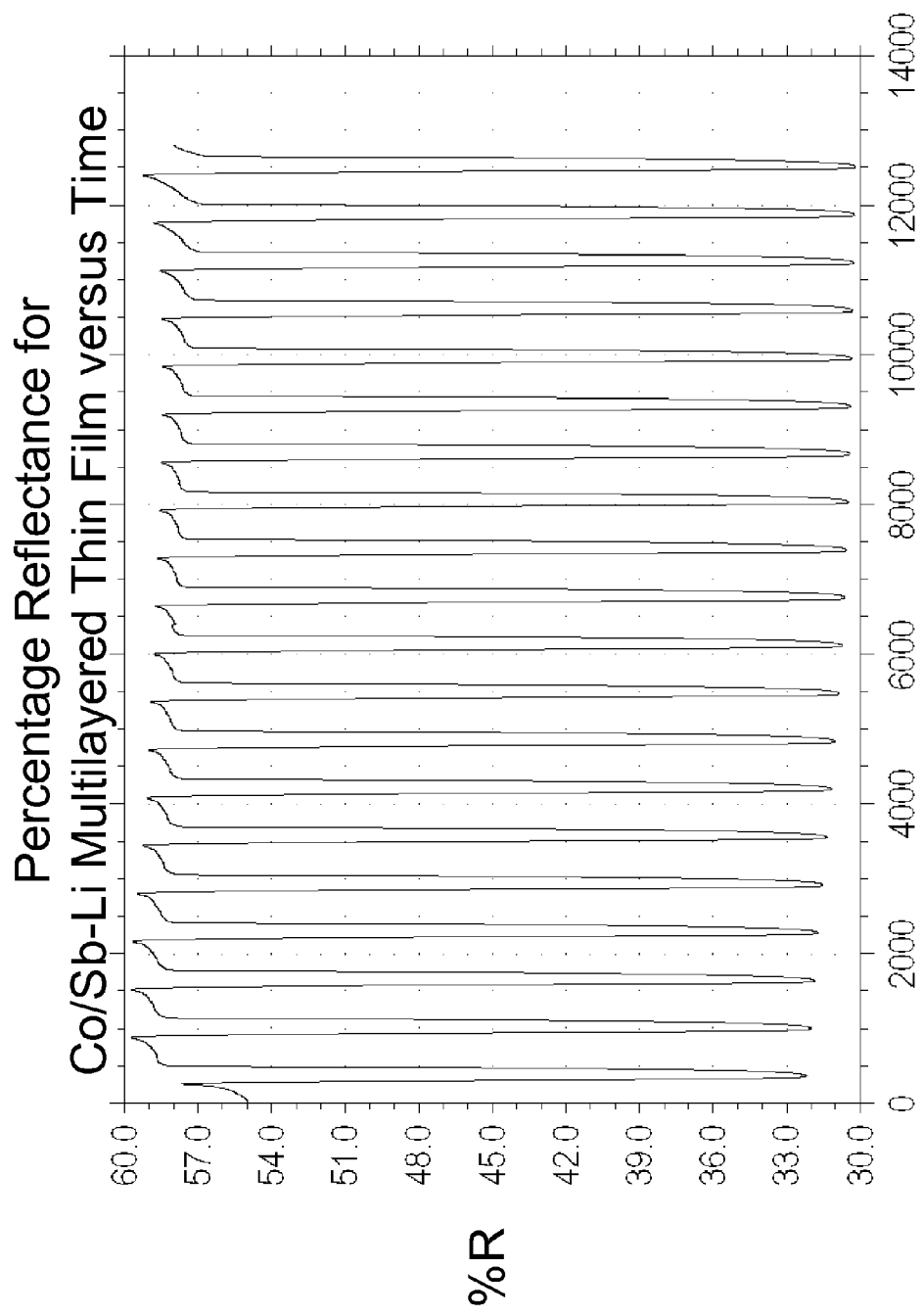

In one exemplary embodiment of the subject matter disclosed herein, a reflection-switchable thin-film material was formed by alternating low-resistivity base metal layers, i.e., Co, with Sb—Li alloy layers to form a multilayered thin-film stack. FIG. 4 graphically shows UV-Vis-NIR transmittance and reflectance spectra for a 30-nm multilayer thin-film stack of [1.5 nm Co/10 nm $SbLi_{0.2}$]$\times_3$ deposited on a glass substrate. Depending upon the embodiment, the thickness of the thin film material can be formed to between about 1 nm to about 400 nm. Selection of a particular thin-film material thickness is a tradeoff between a relatively thin film, which provides a generally higher transmittance, but a generally lower reflectance and durability, and a relatively thick film, which provides a generally lower transmittance, but a generally higher reflectance and better durability. FIGS. 5A and 5B respectively show the plots of percentage transmittance and reflectance versus time for the 30-nm multilayer thin-film stack of [1.5 nm Co/10 nm $SbLi_{0.2}]\times_3$ in a wet cycling cell. The transmittance of the multi-layer thin-film stack switches between about 14% and about 34%. Simultaneously, the reflectance of the multi-layer thin-film stack switches between about 59% and about 30%. Thus, the Co/Sb—Li multilayer thin-film stack provides excellent cyclibility with negligible degradations after at least about one hundred cycles. The transmittance and reflectance of the thin-film samples were simultaneously measured versus time during cycling using a Si photo-detector, which is sensitive to photons in the wavelength range of from about 400 nm to about 1100 nm. It should be understood that other low-resistivity base metals could be used in place of Co, which is used in this exemplary embodiment.

Figure 6:
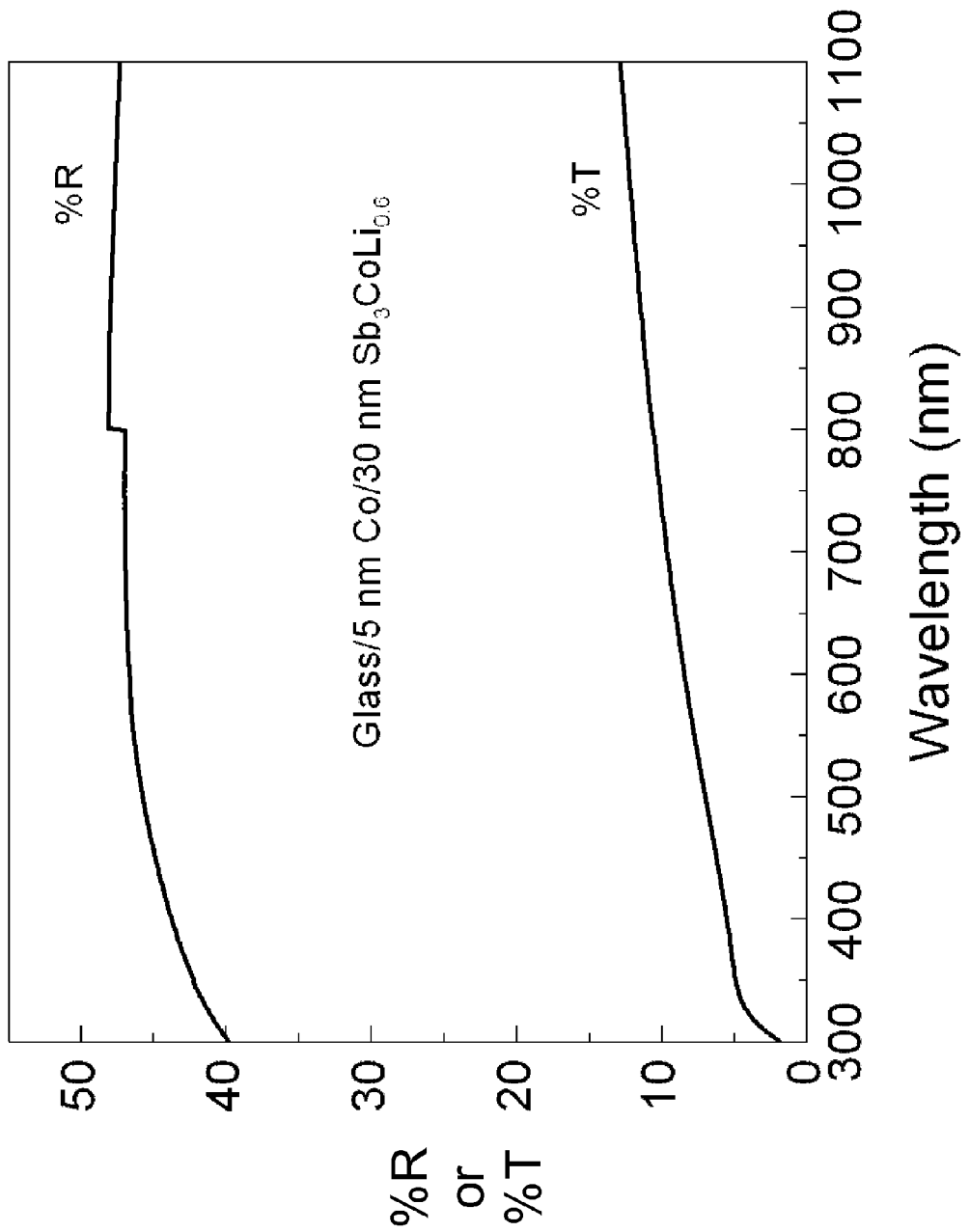
FIG. 6 graphically shows UV-Vis-NIR transmittance and reflectance spectra for a 30-nm $Sb_3CoLi_{0.6}$ thin film deposited on a 5-nm cobalt-coated glass substrate.
Figure 7A:
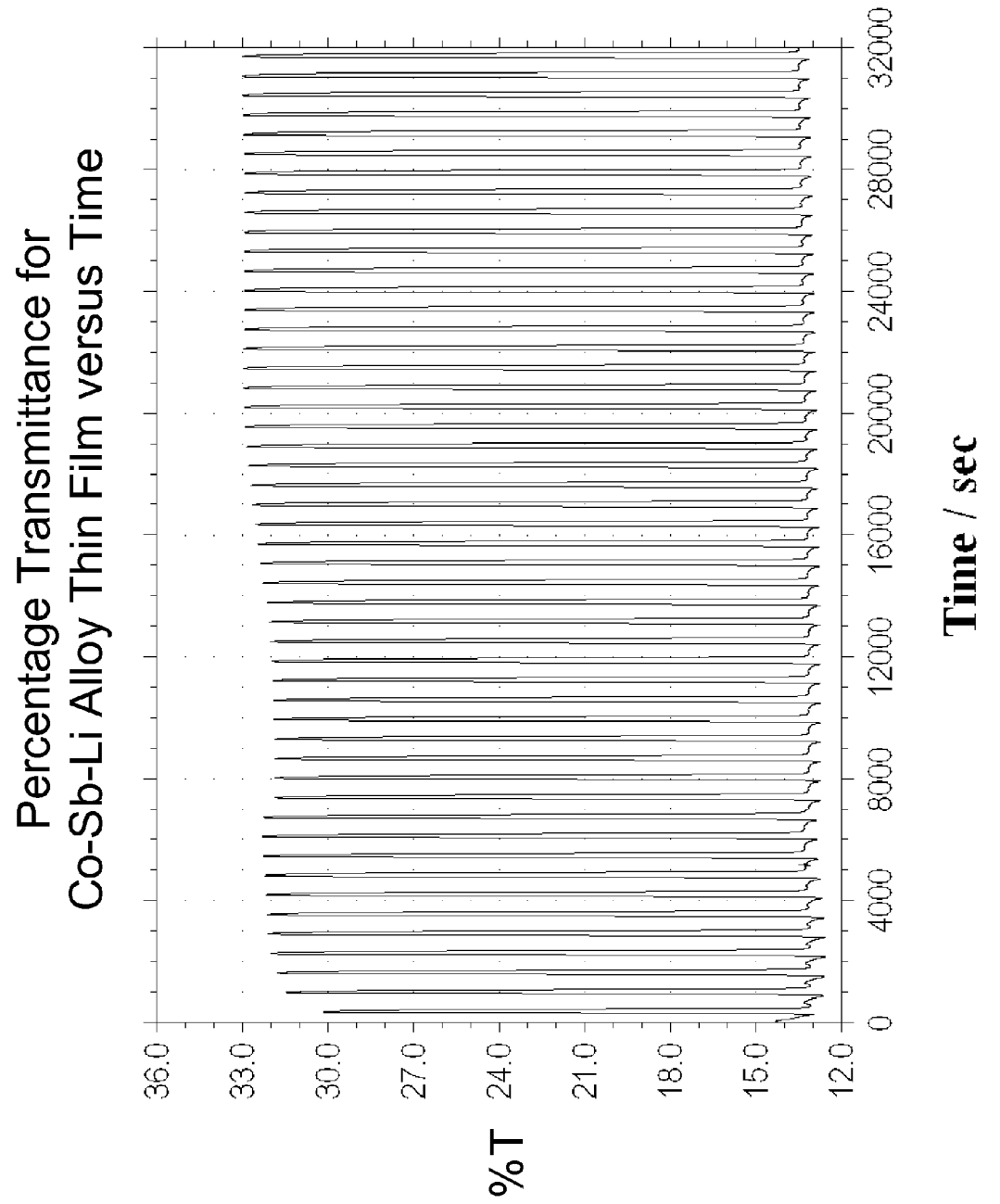
FIGS. 7A and 7B respectively show the percentage transmittance and reflectance characteristics for the $Sb_3CoLi_{0.6}$ alloy thin film in a wet cycling cell.
Figure 7B:
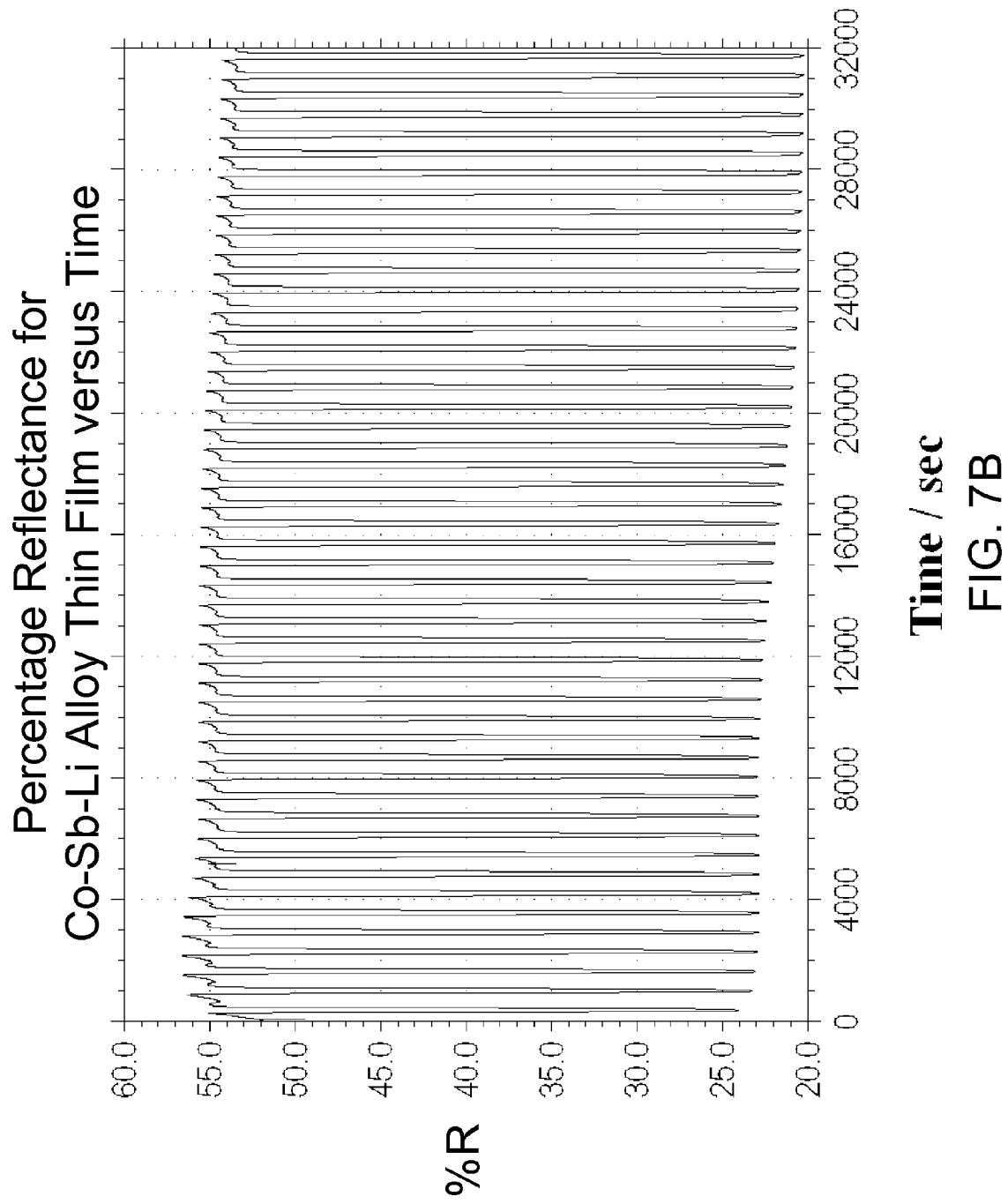

In another exemplary embodiment of the subject matter disclosed herein, a reflection-switchable thin-film material was formed from a low-resistivity base metal, i.e., Co, by co-sputtering the Co with Sb and Li to form an alloy thin film having a composition of $Sb_3CoLi_{0.6}$. Depending upon the embodiment, the thickness of the thin film material can be formed to between about 1 nm to about 400 nm. FIG. 6 graphically shows UV-Vis-NIR transmittance and reflectance spectra for a 30-nm $Sb_3CoLi_{0.6}$ thin film deposited on a 5-nm cobalt-coated glass substrate. Selection of a particular thin-film material thickness is a tradeoff between a relatively thin film, which provides a generally higher transmittance, but a generally lower reflectance and durability, and a relatively thick film, which provides a generally lower transmittance, but a generally higher reflectance and better durability. FIGS. 7A and 7B respectively show the plots of percentage transmittance and reflectance versus time for the $Sb_3CoLi_{0.6}$ alloy thin film in a wet cycling cell. The transmittance of the alloy thin film switches between about 13% and about 32%. Simultaneously, the reflectance of the alloy thin film switches between about 56% and about 23%. The alloy film shows excellent cyclibility with negligible degradations seen after at least about one hundred cycles. The transmittance and reflectance of the thin-film samples were simultaneously measured versus time during cycling using a Si photo-detector, which is sensitive to photons in the wavelength range of from about 400 nm to about 1100 nm. It should be understood that other low-resistivity base metals could be used in place of Co, which is used in this exemplary embodiment.

Figure 8:
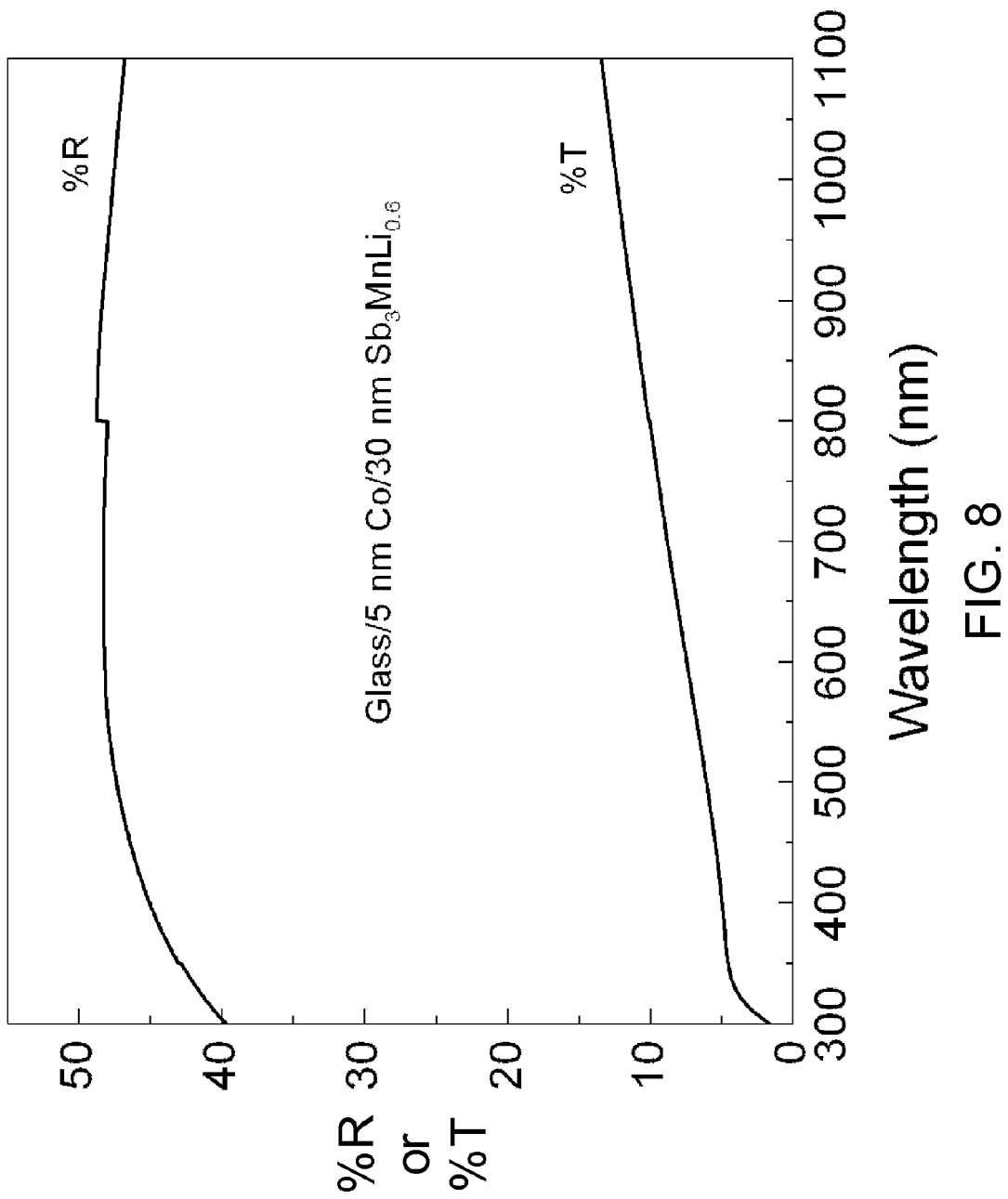
FIG. 8 graphically shows UV-Vis-NIR transmittance and reflectance for a 30-nm $Sb_3MnLi_{0.6}$ thin film deposited on a 5-nm cobalt-coated glass substrate.
Figure 9B:
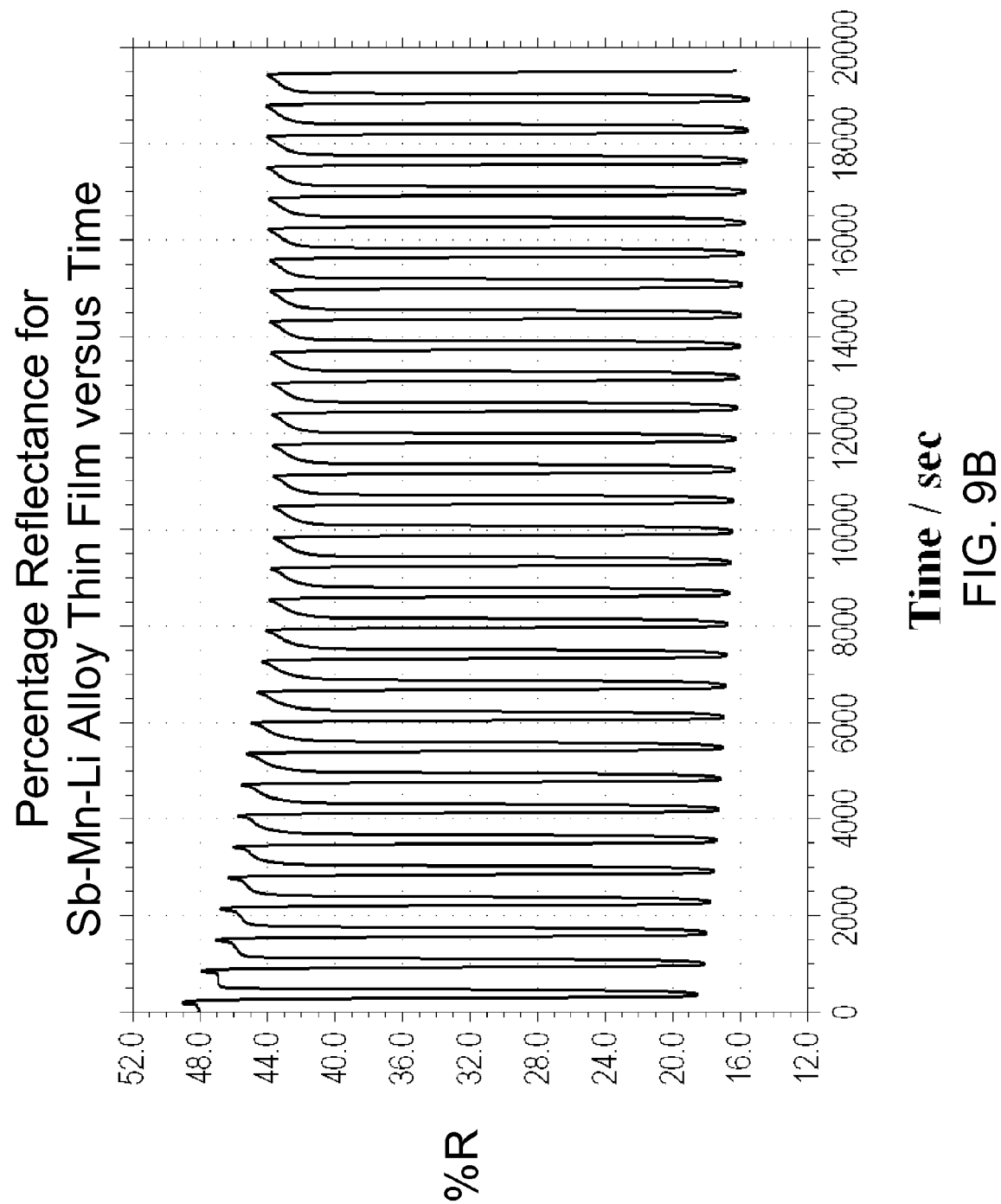

In yet another exemplary embodiment of the subject matter disclosed herein, a reflection-switchable thin-film material was formed from a low-resistivity base metal, i.e., Mn, which was co-sputtered with Sb and Li to form an alloy thin film with the composition of $Sb_3MnLi_{0.6}$. FIG. 8 graphically shows UV-Vis-NIR transmittance and reflectance spectra for a 30-nm $Sb_3MnLi_{0.6}$ thin film deposited on a 5-nm cobalt-coated glass substrate. Depending upon the embodiment, the thickness of the thin film material can be formed to between about 1 nm to about 400 nm. Selection of a particular thin-film material thickness is a tradeoff between a relatively thin film, which provides a generally higher transmittance, but a generally lower reflectance and durability, and a relatively thick film, which provides a generally lower transmittance, but a generally higher reflectance and better durability. FIGS. 9A and 9B respectively show the plots of percentage transmittance and reflectance versus time for the Sb—Mn—Li alloy thin film in a wet cycling cell. The transmittance of the Sb—Mn—Li alloy thin film switches between about 15% and about 44%. The reflectance of the Sb—Mn—Li alloy thin film switches between about 46% and about 17%. The Sb—Mn—Li alloy thin film shows excellent cyclibility with negligible degradations seen after at least about one hundred cycles. The transmittance and reflectance of the thin-film samples were simultaneously measured versus time during cycling using a Si photo-detector, which is sensitive to photons in the wavelength range of from about 400 nm to about 1100 nm. It should be understood that other low-resistivity base metals could be used in place of Mn, which is used in this exemplary embodiment.

Figure 10:
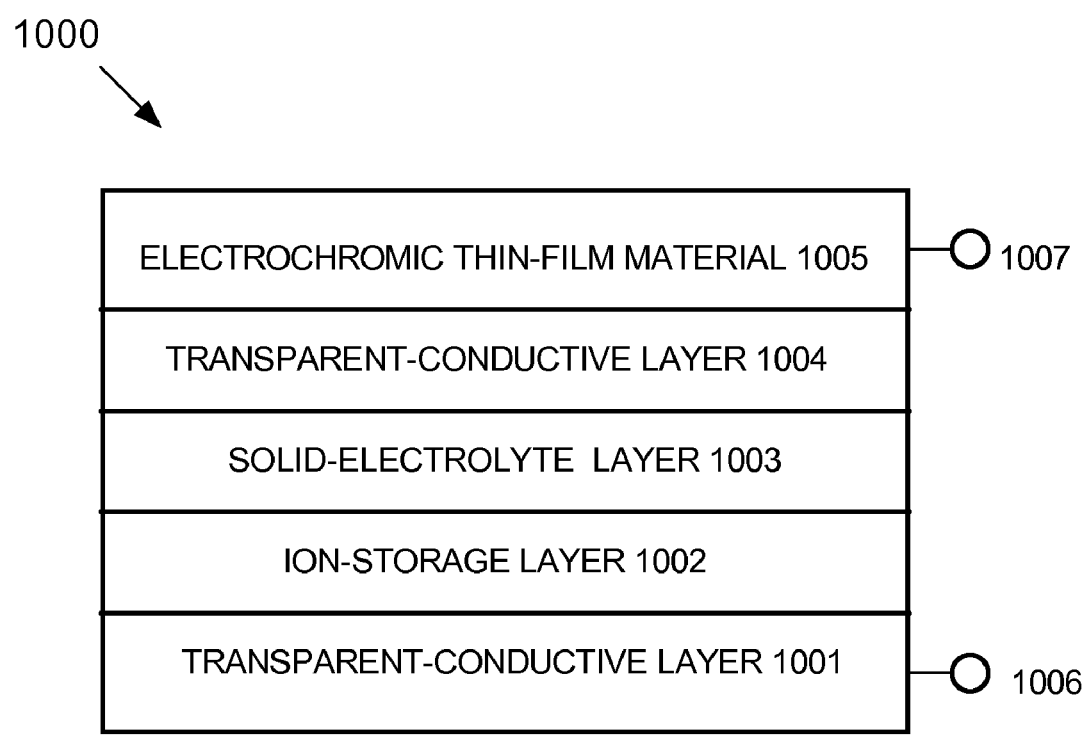
FIG. 10 depicts an exemplary embodiment of a multilayer-stack structure for a solid-state electrochromic device that utilizes an electrochromic thin-film material according to the subject matter disclosed herein.

FIG. 10 depicts an exemplary embodiment of a multilayer-stack structure 1000 for a solid-state electrochromic device that utilizes an electrochromic thin-film material according to the subject matter disclosed herein. Exemplary multilayer-stack structure 1000 comprises a transparent-conductive layer 1001, an ion-storage layer 1002 formed in a well-known manner on transparent-conductive layer 1001, a solid-electrolyte layer 1003 formed in a well-known manner on ion-storage layer 1002, a transparent conductive layer 1004 formed in a well-known manner on solid-electrolyte layer 1003, and an electrochromic thin-film material layer 1005 formed on transparent-conductive layer 1004. In an alternative exemplary embodiment, an additional sublayer of a base metal could be added between transparent-conductive layer 1001 and ion-storage layer 1002 and/or solid-electrolyte layer 1003 and transparent-conductor layer 1004 to further increase the sheet conductance associated with a transparent-conductor layer. Electrochromic thin-film material layer 1005 is formed in accordance with the subject matter disclosed herein. A protective layer could be formed in a well-known manner from a material that is non-permeable to lithium, oxygen, and water could optionally be formed over electrochromic thin-film material layer 1005. Examples of suitable materials for the protective layer include silicon oxide, aluminum oxide, silicon aluminum oxide, zirconium oxide, silicon carbide, and silicon oxycarbide. It should be understood that exemplary multilayer-stack structure 1000 could be used in an exemplary electrochromic device such as disclosed in co-pending and co-assigned U.S. patent Ser. No. 12/242,917, entitled "Reflection-Controllable Electrochromic Device Using a Base Metal as a Transparent Conductor," invented by Zhongchun Wang et al., filed concurrently herewith, and incorporated by reference herein. Additionally, electrical connections to exemplary multilayer-stack structure 1000 are made in a well-known manner to transparent-conductive layer 1001 and electrochromic thin-film material 1005, as respectively depicted by electrical connections 1006 and 1007.

Although the foregoing disclosed subject matter has been described in some detail for purposes of clarity of understanding, it will be apparent that certain changes and modifications may be practiced that are within the scope of the appended claims. Accordingly, the present embodiments are to be considered as illustrative and not restrictive, and the subject matter disclosed herein is not to be limited to the details given herein, but may be modified within the scope and equivalents of the appended claims.

What is claimed is:

1. An electrochromic thin-film material, comprising:
at least one of an alloy of antimony and one or more base metals;
an alloy of antimony, one or more base metals, and lithium; and
an alloy of antimony, one or more base metals, lithium, and one or more noble metals.

2. The electrochromic thin-film material according to claim 1, wherein the one or more base metals comprise Co, Mn, Ni, Fe, Zn, Ti, V, Cr, Zr, Nb, Mo, Hf, Ta, W, Cd, Mg, Al, Ga, In, Sn, Pb, and Bi.

3. The electrochromic thin-film material according to claim 2, wherein a thickness of the thin-film material is between about 1 nm to about 400 nm.

4. The electrochromic thin-film material according to claim 2, wherein the electrochromic thin-film layer comprises reflection-controllable electrochromic thin film material.

5. The electrochromic thin-film material according to claim 2, wherein the electrochromic thin-film material comprises an electrochromically active layer of an electrochromic device.

6. The electrochromic thin-film material according to claim 5, wherein the electrochromic thin-film material becomes transparent upon lithiation and becomes reflective upon delithiation.

7. The electrochromic thin-film material according to claim 5, wherein the electrochromic device comprises a solid-state electrochromic device.

8. The electrochromic thin-film material according to claim 7, wherein the electrochromic device comprises an electrochromic thin-film material, a transparent electrode, and an electrochromic layer formed between the electrochromic thin-film material and the transparent electrode.

9. The electrochromic thin-film material according to claim 5, wherein the electrochromic device is formed on a glass substrate.

10. The electrochromic thin-film material according to claim 9, wherein the electrochromic device and the glass substrate comprise a light-control glass.

11. The electrochromic thin-film material according to claim 2, wherein the thin-film material comprises $Sb_xCoLi_y$, in which $0.5 \leq x \leq 20$, and $0.1 \leq y \leq 20$.

12. The electrochromic thin-film material according to claim 2, wherein the electrochromic thin-film material comprises $Sb_xMnLi_y$, in which $0.5 \leq x \leq 20$, and $0.1 \leq y \leq 20$.

13. The electrochromic thin-film material according to claim 2, further comprising a protective layer formed on the electrochromic thin-film material, the protective layer comprising a material that is non-permeable to lithium, oxygen, and water.

14. An electrochromic thin-film material, comprising a multilayer stack, the multilayer stack comprising:
at least one layer comprising:
one of antimony, antimony-lithium alloy, antimony-one or more base metals alloy, antimony-one or more base metals-lithium alloy, antimony-one or more base metals-one or more noble metals alloy, and antimony-one or more base metals-one or more noble metals-lithium alloy; and at least one alternating layer comprising one of a base metal and a base-metal alloy.

15. The electrochromic thin-film material according to claim 14, wherein the one or more base metals comprise Co, Mn, Ni, Fe, Zn, Ti, V, Cr, Zr, Nb, Mo, Hf, Ta, W, Cd, Mg, Al, Ga, In, Sn, Pb, and Bi.

16. The electrochromic thin-film material according to claim 15, wherein a thickness of the thin-film material is between about 1 nm to about 400 nm.

17. The electrochromic thin-film material according to claim 15, wherein the electrochromic thin-film layer comprises reflection-controllable electrochromic thin film material.

18. The electrochromic thin-film material according to claim 15, wherein the electrochromic thin-film material comprises an alternate multilayer stack of $SbLi_x$ and Co wherein $0 \leq x \leq 10$.

19. The electrochromic thin-film material according to claim 15, wherein the electrochromic thin-film material becomes transparent upon lithiation and becomes reflective upon delithiation.

20. The electrochromic thin-film material according to claim 15, wherein the electrochromic thin-film material comprises an electrochromically active layer of an electrochromic device.

21. The electrochromic thin-film material according to claim 20, wherein the electrochromic device is a solid-state electrochromic device.

22. The electrochromic thin-film material according to claim 21, wherein the electrochromic device comprises an electrochromic thin-film material, a transparent electrode, and an electrolyte formed between the electrochromic thin-film material and the transparent electrode.

23. The electrochromic thin-film material according to claim 19, wherein the electrochromic device is formed on a glass substrate.

24. The electrochromic thin-film material according to claim 23, wherein the electrochromic device and the glass substrate comprise a light-control glass.

25. The electrochromic thin-film material according to claim 15, wherein the thin-film material comprises $SbLi_x$ in which $0.01 \leq x \leq 10$.

26. The electrochromic thin-film material according to claim 25, wherein $0.1 \leq x \leq 0.6$.

27. The electrochromic thin-film material according to claim 15, further comprising a transparent protective layer formed on the electrochromic thin-film material, the protective layer comprising a material that is non-permeable to lithium, oxygen, and water.

* * * * *